United States Patent
Hoegerl et al.

(10) Patent No.: US 9,135,549 B2
(45) Date of Patent: Sep. 15, 2015

(54) SMART CARD MODULE, SMART CARD AND METHOD FOR PRODUCING A SMART CARD MODULE

(71) Applicant: Infineon Technologies AG, Neubiberg (DE)

(72) Inventors: Juergen Hoegerl, Regensburg (DE); Frank Pueschner, Kelheim (DE); Peter Stampka, Burglengenfeld (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 14/287,265

(22) Filed: May 27, 2014

(65) Prior Publication Data

US 2014/0353384 A1  Dec. 4, 2014

(30) Foreign Application Priority Data

May 30, 2013  (DE) .......................... 10 2013 105 575

(51) Int. Cl.
| | |
|---|---|
| G06K 19/00 | (2006.01) |
| G06K 19/06 | (2006.01) |
| H01L 23/48 | (2006.01) |
| H01L 23/52 | (2006.01) |
| H01L 29/40 | (2006.01) |
| G06K 19/077 | (2006.01) |
| H01L 23/538 | (2006.01) |

(52) U.S. Cl.
CPC .... G06K 19/07707 (2013.01); G06K 19/07775 (2013.01); H01L 23/5386 (2013.01); H01L 23/5388 (2013.01); *H01L 2224/16225* (2013.01)

(58) Field of Classification Search
CPC ................. G06K 19/07707; G06K 19/07775; H01L 23/5386; H01L 23/5388; H01L 2224/16225
See application file for complete search history.

(56) References Cited

U.S. PATENT DOCUMENTS

| | | | | |
|---|---|---|---|---|
| 6,297,789 B2 * | 10/2001 | Gauthier et al. | ................. | 345/87 |
| 6,440,773 B1 * | 8/2002 | Usami | ........................... | 438/107 |
| 8,410,592 B2 | 4/2013 | Otremba et al. | | |
| 8,448,868 B2 | 5/2013 | Mueller-Hipper et al. | | |
| 2003/0172279 A1* | 9/2003 | Yudasaka | ....................... | 713/176 |
| 2004/0159709 A1* | 8/2004 | Ohta et al. | .................... | 235/492 |
| 2005/0045729 A1* | 3/2005 | Yamazaki | ..................... | 235/492 |
| 2005/0167513 A1* | 8/2005 | Ogawa et al. | ................. | 235/492 |

(Continued)

FOREIGN PATENT DOCUMENTS

| | | | |
|---|---|---|---|
| DE | 19516227 A1 | 11/1996 | |
| DE | 19954941 C2 | 11/2003 | |

(Continued)

OTHER PUBLICATIONS

Office Action dated Apr. 2, 2014 issued in the parallel German application.

*Primary Examiner* — Daniel Walsh (57) ABSTRACT

A smart card module includes a carrier; a chip arrangement arranged over a first side of the carrier; and an antenna arranged over a second side of the carrier, wherein the second side of the carrier is opposite the first side of the carrier. The antenna is electrically conductively connected to the chip arrangement in order to transmit electrical signals. The smart card module further includes a display module arranged over the first side of the carrier; and at least one electrical line structure arranged on the first side of the carrier, which electrical line structure electrically conductively connects the chip arrangement and the display module to one another.

24 Claims, 8 Drawing Sheets

(56) References Cited

U.S. PATENT DOCUMENTS

| | | | |
|---|---|---|---|
| 2005/0194591 A1* | 9/2005 | Usami et al. | 257/48 |
| 2005/0199734 A1* | 9/2005 | Puschner et al. | 235/492 |
| 2008/0035741 A1* | 2/2008 | Sakama | 235/492 |
| 2008/0061152 A1* | 3/2008 | Shingai et al. | 235/492 |
| 2009/0206165 A1* | 8/2009 | Laackmann et al. | 235/492 |
| 2010/0019370 A1* | 1/2010 | Pressel et al. | 257/690 |
| 2010/0067200 A1 | 3/2010 | Ewe | |
| 2010/0090009 A1* | 4/2010 | Droz | 235/488 |
| 2011/0101108 A1* | 5/2011 | Slikkerveer et al. | 235/492 |
| 2012/0061474 A1* | 3/2012 | Lien | 235/492 |
| 2013/0009826 A1* | 1/2013 | Wu | 343/702 |
| 2013/0062419 A1* | 3/2013 | Finn et al. | 235/492 |
| 2013/0146671 A1* | 6/2013 | Grieshofer et al. | 235/492 |
| 2013/0322217 A1* | 12/2013 | Aizawa et al. | 368/14 |
| 2014/0353384 A1* | 12/2014 | Hoegerl et al. | 235/488 |

FOREIGN PATENT DOCUMENTS

| | | |
|---|---|---|
| DE | 102006047761 A1 | 4/2008 |
| DE | 102008046407 A1 | 3/2010 |
| DE | 102009052160 A1 | 5/2011 |
| DE | 102011001722 A1 | 10/2012 |
| WO | 9635190 A2 | 11/1996 |
| WO | 0137338 A2 | 5/2001 |
| WO | 2012130623 A2 | 10/2012 |

* cited by examiner

SMART CARD MODULE, SMART CARD AND METHOD FOR PRODUCING A SMART CARD MODULE

CROSS-REFERENCE TO RELATED APPLICATION

This application claims priority to German Patent Application Serial No. 10 2013 105 575.3, which was filed May 30, 2013, and is incorporated herein by reference in its entirety.

TECHNICAL FIELD

Various embodiments relate generally to a smart card module, a smart card and a method for producing a smart card module.

BACKGROUND

In general, a wide application area can be found for smart cards, depending on the specific embodiments. Smart cards, or else chip cards or integrated circuit cards (ICC), can have an integrated chip module. In daily use, smart cards can be subjected correspondingly to mechanical loads, with the result that they should preferably be robust in respect of mechanical loads. Primarily, a chip module (or a chip), which can be arranged in a smart card housing, can be destroyed or damaged in the event of the occurrence of mechanical loads, with the result that the functionality of the smart card can be impaired or suppressed, for example.

SUMMARY

A smart card module includes a carrier; a chip arrangement arranged over a first side of the carrier; and an antenna arranged over a second side of the carrier, wherein the second side of the carrier is opposite the first side of the carrier. The antenna is electrically conductively connected to the chip arrangement in order to transmit electrical signals. The smart card module further includes a display module arranged over the first side of the carrier; and at least one electrical line structure arranged on the first side of the carrier, which electrical line structure electrically conductively connects the chip arrangement and the display module to one another.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DESCRIPTION

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

In the detailed description below, reference is made to the attached drawings which form part of the description and in which specific embodiments are shown for illustrative purposes, in which embodiments the invention can be executed. In this regard, directional terminology such as "at the top", "at the bottom", "at the front", "at the rear", "front", "rear", etc. is used with reference to the orientation of the figure(s) described. Since components of embodiments can be positioned in a number of different orientations, the directional terminology is used for illustrative purposes and is in no way restrictive. It goes without saying that other embodiments can be used and structural or logical modifications can be performed without departing from the scope of protection of the present invention. It goes without saying that the features of the various exemplary embodiments described herein can be combined with one another where not specified otherwise. The detailed description below should therefore not be interpreted in any restrictive sense, and the scope of protection of the present invention is defined by the attached claims.

Within the scope of this description, the terms "connected" and "coupled" are used to describe both a direct and an indirect connection and a direct or indirect coupling. In the figures, identical or similar elements are provided with identical reference symbols, insofar as this is expedient.

One aspect of various embodiments would appear to be that a smart card module on the basis of a flexible carrier and a flexible chip is provided, with the result that the smart card module can be used in a smart card, wherein the smart card module can be robust with respect to external mechanical loads, and wherein the smart card module can also have a display module or a flexible display module.

In addition, another aspect of various embodiments would appear to be that a smart card is provided which can offer a plurality of functionalities at the same time, wherein the smart card can have a flexible chip arrangement, for example, which provides a first functionality of the smart card, for example personal identification by means of an RFID (radiofrequency identification) chip, and provides a second functionality, for example the operation of a display module integrated in the smart card by means of a driver chip.

In addition, a flexible smart card module can be provided which includes a flexible chip arrangement and a flexible display module, for example a flexible OLED display (display module based on organic light-emitting diodes), wherein the chip arrangement actuates the display module and at the same time provides a further functionality, for example RFID.

Such a flexible smart card module can be integrated in a smart card, for example, wherein the smart card can have an improved life since the flexible smart card module can withstand mechanical loading more effectively.

In addition, a smart card module or a flexible smart card module can be provided which has a chip arrangement, wherein the chip arrangement can be covered (or hidden) by a security layer, for example, wherein the smart card module is connected (for example galvanically, in other words electrically conductively) to a display module and is connected to an antenna structure, with the result that the smart card module can provide a plurality of functionalities (for example RFID, data storage and/or operation of the display module). The electrical line routing can in this case be designed such that functional security features (for example structured interlayers) can be integrated in the smart card module in order to protect, for example, the chip arrangement from external analyses or attacks and at the same time to provide interfaces and/or contacts matched to the components (display module and/or antenna). As a result, for example, the complexity of the fitting processes for producing the smart card can be reduced.

In accordance with various embodiments, a smart card module may include the following: a carrier; a chip arrangement arranged over a first side of the carrier; an antenna arranged over a second side of the carrier, wherein the second side of the carrier is opposite the first side of the carrier; wherein the antenna is electrically conductively connected to the chip arrangement in order to transmit electrical signals; a display module arranged over the first side of the carrier; and at least one electrical line structure arranged on the first side of the carrier, which electrical line structure electrically conductively connects the chip arrangement and the display module to one another.

In addition, the chip arrangement may have a plurality of chips. Thus, for example, a plurality of functionalities can be provided for one smart card or one smart card module.

In addition, at least one first chip of the plurality of chips can be electrically conductively connected to at least one second chip of the plurality of chips. In other words, the chip arrangement can have a plurality of chips which can interact with one another. This may increase, for example, the security aspect of a smart card or of a smart card module with stored confidential information, for example, since a security chip can be integrated in the chip arrangement, for example, wherein, in addition, the entire chip arrangement can be protected by means of additional functional security features (for example structured interlayers).

In accordance with various embodiments, a smart card module may further include at least one additional electrical line structure arranged on the first side of the carrier, which electrical line structure can electrically conductively connect the at least one first chip of the plurality of chips to the at least one second chip of the plurality of chips.

In addition, the chip arrangement can have at least one driver chip, which is designed to activate the display module. Since the driver chip can be integrated in the chip arrangement, this can contribute to the manipulation security of the smart card module.

In addition, the chip arrangement can have a memory chip for storing data. Since the memory chip can be integrated in the chip arrangement, this can contribute to the manipulation security of the smart card module.

In addition, the chip arrangement can have an RF chip (radiofrequency chip) or an RFIC (radiofrequency integrated circuit), which can be coupled to the antenna, for example, for the contactless transmission of signals and/or data, for example between the chip arrangement and an external transmission device and/or reception device.

In addition, the chip arrangement can have precisely one chip. In addition, the chip arrangement can have a system on a chip (SoC). Thus, for example, a plurality of functionalities can be provided by means of one chip.

In addition, the chip arrangement can have a security chip, which is designed to provide at least one cryptographic service. In this case, a cryptographic service can comprise at least one of the following, for example: cryptographic hash function; authentication; digital signature; encoding (symmetrical or asymmetrical); or the like.

In addition, a chip or a plurality of chips of the chip arrangement may have a thickness in a region of less than approximately 70 μm. In addition, a chip or the plurality of chips of the chip arrangement may have a thickness in a region of less than approximately 100 μm. In addition, a chip or the plurality of chips of the chip arrangement may have a thickness in a region of less than approximately 200 μm. In addition, all of the chips of the chip arrangement may have the same thickness. In addition, the entire chip arrangement can be flexible, for example owing to the material (for example substantially silicon) and the reduced thickness of the chips integrated in the chip arrangement.

In addition, the carrier may have a thickness in a region of less than approximately 100 μm. In addition, the carrier may have a thickness in a region of less than approximately 70 μm. In addition, the carrier can consist of a polymeric material or a plastic. In addition, the carrier can be flexible, for example owing to the material (for example polyimide, epoxy) or the reduced thickness of the carrier. For example, the carrier can be a flexible printed circuit board (PCB).

Furthermore, the electrical line structure may have at least one electrically conductive solder ball and at least one electrical conductor track, wherein the at least one electrical conductor track may extend parallel to the first side of the carrier on the first side of the carrier, and wherein the at least one solder ball can electrically conductively connect the at least one conductor track to at least one contact pad of the display module. Instead of or in addition to the at least one solder ball, at least one so-called stud bump can be provided or one or more other suitable solder structures.

In addition, the electrical line structure may have at least one electrically conductive pin and at least one electrical conductor track, wherein the at least one electrical conductor track can extend parallel to the first side of the carrier on the first side of the carrier, and wherein the at least one pin can electrically conductively connect the at least one conductor track to at least one contact pad of the display module.

In accordance with various embodiments, a smart card module may furthermore include at least one structured security layer, which can be arranged above and/or below the chip arrangement. The structured security layer can make more difficult or prevent, for example, an analysis of the chip arrangement and/or the chips of the chip arrangement, for example an analysis by means of optical devices and/or optical analysis methods. This can increase, for example, the manipulation security of the smart card and/or of the smart card module. In this case, for example, part of the electrical line routing between the chip arrangement and the display module can pass through the structured security layer, wherein the smart card module and the electrical line routing can be designed and arranged in such a way that the electrical connection between the display module and the chip arrangement does not reduce the manipulation security. In other words, the structured security layer can cover the chip arrangement correspondingly and at the same time electrical line routing can be provided between the chip arrangement and the display unit.

In addition, at least one chip of the chip arrangement can be at least partially surrounded by a molding compound or embedded in a top layer. In addition, at least one chip of the chip arrangement can be surrounded completely by a molding compound. In addition, a plurality of chips of the chip arrangement can be at least partially surrounded by a molding compound. In addition, a plurality of chips of the chip arrangement can be completely surrounded by a molding compound. In addition, all of the chips of the chip arrangement can be at least partially surrounded by a molding compound. In addition, all of the chips of the chip arrangement can be completely surrounded by a molding compound.

In addition, the molding compound or the top layer can have one or more cutouts, for example for providing electrical contacts through the molding compound or top layer.

In accordance with various embodiments, the display module can have or be an electronic paper display.

In accordance with various embodiments, the display module can have or be a light-emitting diode display.

In accordance with various embodiments, the display module can have or be a light-emitting diode display based on organic light-emitting diodes (an OLED display).

In accordance with various embodiments, the display module may have or be a liquid crystal display.

In accordance with various embodiments, a smart card may include the following: a smart card module, as described herein; and a smart card body, wherein the smart card module is connected to the smart card body.

In addition, the smart card module may be connected to the smart card body by means of an adhesive or an adhesive polymer.

In addition, the smart card module can be connected to the smart card body and designed in such a way that the display module is exposed towards one side of the smart card body.

In accordance with various embodiments, a smart card may additionally include a smart card body antenna, which can be arranged in the smart card body and/or designed in such a way that the smart card body antenna is inductively coupled to the antenna of the smart card module. In addition, the smart card body antenna can be a booster antenna for the antenna of the smart card module. In addition, the booster antenna and the antenna of the smart card module can be designed in such a way that contactless data transfer can take place between the smart card module and an external device.

In accordance with various embodiments, a chip module may include at least the following: a flexible carrier; a (for example flexible) chip arrangement arranged on a first side of the carrier, said chip arrangement including a plurality of (for example flexible) chips; a contact structure arranged on a second side of the carrier, wherein the second side of the carrier is opposite the first side of the carrier, wherein the contact structure is electrically conductively connected to at least one chip of the plurality of chips; at least one electrical line structure arranged on the first side of the carrier, which electrical line structure electrically conductively connects at least two chips of the plurality of chips to one another; and a (for example flexible) display element arranged over the first side of the carrier, wherein the display element is electrically conductively connected to at least one chip of the plurality of chips by means of the electrical line structure.

In accordance with various embodiments, the combination of a flexible display with a flexible chip arrangement on a flexible carrier can make possible optimal mechanical stability and ability of the arrangement to withstand mechanical loads. In addition, the data transmission to external devices can also be provided by means of a contactless interface, for example by means of a flexible antenna structure on the flexible carrier, with the result that the smart card module and/or the smart card can have at least one of the following: an extended life in daily use, improved durability, improved protection from damage in the event of mechanical loading.

In accordance with various embodiments, a smart card module or chip module can be constructed from flexible components, for example thin flexible chips, a flexible display element (for example an OLED structure), a flexible carrier for the chips and the display element (for example a thin polymer or plastics carrier). Such a smart card module or chip module can have greater flexibility than conventional smart card modules, with the result that the smart card module or chip module can withstand mechanical loading, for example point loading or bending loading, more effectively.

In addition, the chip module can have an antenna arranged on the second side of the flexible carrier, wherein the antenna is electrically conductively connected to the contact structure. The antenna can be, for example, a thin structured metal layer which can be arranged on the side of the flexible carrier opposite the chip arrangement, with the result that the antenna structure on the carrier is likewise flexible.

In addition, the display module can be designed and arranged relative to the chip arrangement in such a way that the chip arrangement can be reinforced and/or protected.

In addition, the electrical line structure on the first side of the carrier (or of the flexible carrier) can have a multiplicity of contact structures (or contact pads), for example laterally offset with respect to the chip arrangement, wherein the electrical line structure can be designed in such a way that the respective positions of the contact structures on the carrier can be matched to a display module contact structure of the display module. In other words, the display module can have, for example, a contact pad structure, and the smart card module (or the chip module) can have an electrical line structure matched to the contact pad structure of the display module.

In accordance with various embodiments, the chip module can furthermore have at least one security layer arranged over the first side of the carrier in order to prevent an optical analysis of the chip arrangement.

In accordance with various embodiments, the chip module can further have at least one security layer arranged over the second side of the carrier in order to prevent an optical analysis of the chip arrangement.

In addition, the chip arrangement can have a thickness in a region of less than approximately 100 µm. In addition, each chip of the plurality of chips can have a thickness in a region of less than approximately 100 µm.

In addition, the flexible carrier may include a polymeric material and/or a laminate material.

In addition, the flexible carrier can have a thickness in a region of less than approximately 100 µm. In addition, the flexible carrier can have, for example, a thickness in a range of from approximately 40 µm to 60 µm.

In accordance with various embodiments, a method for producing a smart card module may include the following: forming an electrical line structure on a first side of a carrier designed in such a way as to electrically conductively connect a chip arrangement and a display module; forming a chip arrangement over the first side of the carrier; forming a display module over the first side of the carrier, wherein the display module is electrically conductively connected to the chip arrangement by means of the electrical line structure; and forming an antenna over a second side of the carrier, which is opposite the first side of the carrier, wherein the antenna is electrically conductively connected to the chip arrangement in order to transmit electrical signals.

In accordance with various embodiments, a smart card module, a smart card and a method for producing a smart card module are described below. The smart card module (or chip module) described herein or the smart card described herein can be less sensitive to mechanical loading or more able to withstand mechanical loading than a conventional smart card module (or chip module) or a conventional smart card since, in accordance with various embodiments, for example, flexible materials and/or flexible component parts are used in order to provide the smart card module or the chip module. A smart card module can have, for example, a flexible carrier, on which a flexible chip or a plurality of flexible chips is/are arranged and/or fastened, with the result that this flexible (or deformable) smart card module can compensate for mechanical loading without breaking or being damaged, for example.

At least the following can be understood herein by way of example as meaning mechanical loading: a mechanical pressure, a mechanical stress, a torsional stress, a bending stress, a deformation, an expansion, bending, a tensile stress, a compressive stress, an elastic deformation, a punctiform loading or force or the like.

A rigidity can in this case be understood to mean the resistance of a part or of a component of the smart card module to elastic deformation, for example owing to a force or a torque. The rigidity of a part or of a component of the smart card module can be dependent on the material involved and the geometry, for example. The flexibility can in this case be considered to be the inverse of the rigidity. A flexible component (chip, carrier, display, etc.) of the smart card module can accordingly have a low rigidity and a high flexibility.

In addition, a flexible body or a flexible component, as described herein, can enable reversible (or elastic) deformation of the body or of the component.

In accordance with various embodiments, the carrier for providing a smart card module can be formed from a flexible material and/or have a corresponding thickness, with the result that the carrier is flexible. The carrier can have, for example, a thickness of less than or equal to 100 μm and consist of a polymeric material or epoxy material, with the result that the carrier can be flexible.

A chip which can be arranged, for example, on the flexible carrier and can be part of the chip arrangement can have a thickness of less than or equal to 100 μm and, for example, substantially consist of silicon or comprise silicon. Such a thin or ultra-thin silicon chip can be flexible (for example flexibly or reversibly deformable), with the result that the chip can withstand mechanical loading, for example without breaking.

A smart card module (a chip, a chip module or a chip arrangement) can have, for example, one or more metalization structures (metalizations or metalization layers), containing, for example, an electrical line structure and a dielectric layer structure, which can make possible and/or provide the electrical functionality of the chip arrangement and/or of the smart card module.

Therefore, a smart card module whose mechanical properties are influenced by the mechanical properties of a chip arrangement and the thickness of the chips in the chip arrangement can have increased mechanical flexibility as the thickness of the chips decreases and can therefore withstand a higher mechanical loading without breaking. A silicon chip can be brittle, for example, and have a tendency to break when the thickness of the chip exceeds a specific thickness, for example a thickness of approximately 100 μm.

In accordance with various embodiments, a smart card module is provided which has a high level of resistance to mechanical loading and which has a display module which is designed in such a way that the manipulation security of the chip arrangement of the smart card module is not impaired.

In accordance with various embodiments, a smart card module is provided which can provide a chip arrangement comprising a plurality of chips and which can have a high level of resistance to mechanical loading. In accordance with various embodiments, a smart card module is provided which can provide a chip arrangement comprising a plurality of chips and which can have a high level of resistance to mechanical loading and which can have a display module which is designed in such a way that the manipulation security of the chip arrangement is not impaired.

Figure 1A:
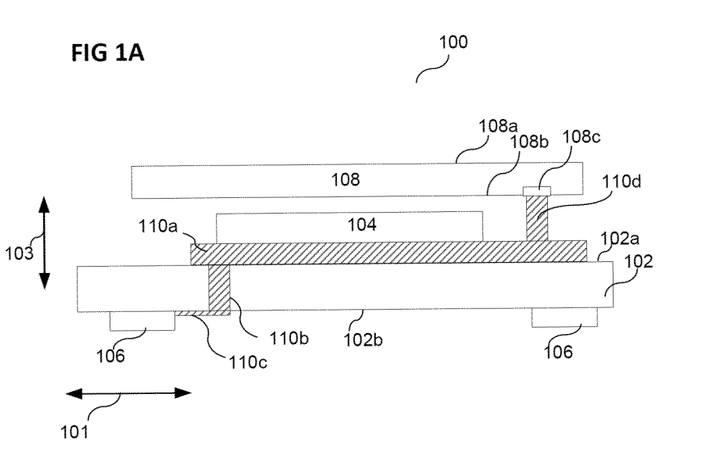
FIGS. 1A to 1E each show a schematic view of a smart card module, in accordance with various embodiments.

FIG. 1A shows a schematic cross-sectional view or side view of a smart card module 100, in accordance with various embodiments. In accordance with various embodiments, the smart card module 100 can have a carrier 102, a chip arrangement 104, an antenna 106 (or antenna structure 106), a display module 108 and, for example, an electrical line routing.

In accordance with various embodiments, the antenna 106 can be arranged over a second side 102b of the carrier 102. The second side 102b of the carrier 102 can be opposite the first side 102a of the carrier 102.

In accordance with various embodiments, the carrier 102 may include or essentially consist of at least one of the following materials: a polymer, a plastic, polyimide, a laminate, a composite material (fiber-reinforced polymer) or another suitable carrier material, such as, for example, flexible printed circuit boards or, for example, carriers consisting of a plurality of polyimide layers. The carrier 102 may, for example, include or essentially consist of a material which can have sufficiently high mechanical resistance to tearing (for example polyimide or a glass-epoxy system, such as FR4, for example). The carrier 102 can be a film, for example.

In accordance with various embodiments, a chip arrangement 104 can be arranged on a first side 102a of the carrier 102. The chip arrangement 104 can have, for example, a chip or a plurality of chips, for example two, three, four, five, six, seven, eight, nine or ten chips, or more than ten chips. In accordance with various embodiments, the chip arrangement 104 can have at least one chip from the following group of chips: a logic chip, an RF chip, an RFID chip, a memory chip, a microprocessor chip, an SoC, a security chip, a transponder chip and/or a driver chip for a display module.

The chip arrangement 104 can have, for example, a plurality of chips, wherein said chips can provide different functionalities, for example personal identification, security functions such as encoding, for example, display functions by means of a display 108 integrated in the smart card module 100, memory functions, or data transmission functions.

In accordance with various embodiments, the chip arrangement 104 can therefore have various contact connections or contact connection possibilities, with the result that, for example, the corresponding components can be electrically conductively connected to the chip arrangement 104. For example, the chip arrangement 104 can provide various interfaces, for example an interface for the contactless transmission of data can be provided by means of an antenna 106 coupled to the chip arrangement 104, wherein, at the same time, a contact structure 110a can provide a contact-based interface, with the result that a display module 108 can be coupled to the chip arrangement 104, for example.

In accordance with various embodiments, the smart card module can have a first electrical line structure 110a on the first side 102a of the carrier 102. The first electrical line structure 110a can be, for example, a metalization layer 110a or an electrical line routing structure 100a. The metalization layer 110a or the electrical line routing structure 100a can have, for example, a structured metal layer, for example a structured copper layer or a structured aluminum layer. In addition, the metalization layer 110a or the electrical line routing structure 100a may include a dielectric material, for example an electrically insulating material (for example an electrically insulating polymeric material).

In addition, an electrical line structure (for example the first electrical line structure 110a) can have or consist of a structured layer, for example a structured copper layer, which has been formed by means of copper etching technology, for example. In addition, the electrical line structure 110a can have a structured aluminum layer, which has been formed by means of aluminum etching technology, for example.

In accordance with various embodiments, the smart card module 100 can have a via 110b or a plurality of vias 110b, which can electrically conductively connect, for example, the first electrical line structure 110a on the first side of the carrier 102 to an optional second electrical line structure 110c on the second side 102b of the carrier 102. In addition, the second electrical line structure 110c on the second side 102b of the carrier 102 can be electrically conductively connected to an antenna 106 or antenna structure 106 on the second side 102b of the carrier 102.

In addition, the smart card module 100 can have a via 110b or a plurality of vias 110b which can electrically conductively connect, for example, the first electrical line structure 110a on the first side of the carrier 102 to an antenna 106 or antenna structure 106 on the second side 102b of the carrier 102.

In accordance with various embodiments, the chip arrangement 104 can be electrically conductively connected to the antenna 106 or the antenna structure 106 by means of the first electrical line structure 110a on the first side 102a of the carrier 102, the via 110b, and optionally the second electrical line structure 110c on the second side 102b of the carrier. In addition, as illustrated in FIG. 1A, the first electrical line structure 110a can be arranged between the chip arrangement 104 and the carrier 102.

In accordance with various embodiments, at least one chip of the chip arrangement 104 can be electrically conductively connected to the antenna 106 or the antenna structure 106 by means of the first electrical line structure 110a on the first side 102a of the carrier 102, the via 110b, and optionally the second electrical line structure 110c on the second side 102b of the carrier. Therefore, at least one chip of the chip arrangement 104 can transmit data to a periphery or receive data from a periphery by means of the antenna 106 or the antenna structure 106. A periphery can be, for example, an external RF reader or an external RFID reader.

In accordance with various embodiments, the antenna 106 or the antenna structure 106 may include or essentially consist of at least one of the following materials: a metal, a metallic material, an alloy, an intermetallic compound, copper, aluminum, titanium, titanium nitride, tungsten, doped silicon (polysilicon), gold, silver, nickel, zinc, an aluminum-silicon alloy. In addition, the antenna 106 or the antenna structure 106 can have or consist of a structured layer, for example a structured copper layer, which has been formed by means of copper etching technology, for example. In addition, the antenna 106 or the antenna structure 106 can have a structured aluminum layer, which has been formed by means of aluminum etching technology, for example.

In accordance with various embodiments, a display module 108 can be arranged on the first side 102a of the carrier 102. The display module 108 can be arranged above the chip arrangement 104, for example. In addition, the first electrical line structure 110a, 110d can be arranged on the first side of the carrier 102 and designed in such a way that the chip arrangement (or at least one chip of the chip arrangement 104) and the display module 108 are electrically conductively connected to one another. In addition, the at least one electrical line structure can have a solder ball (or solder sphere) on the first side 102a of the carrier 102. In other words, a solder ball 110d or a pin 110d can be provided on the first side 102a of the carrier 102, with the result that the chip arrangement 104 can be electrically conductively connected to the display module 108.

In accordance with various embodiments, the smart card module 104 can have a first electrical line structure 110a on the first side 102a of the carrier 102 and a corresponding contact structure arrangement 110d (for example a BGA (ball grid array) or a PGA (pin grid array)), wherein the first electrical line structure 110a on the first side 102a of the carrier 102 and the contact structure arrangement 110d can be designed and arranged relative to the display module 108 in such a way that the display module 108 is electrically conductively connected to at least one chip of the chip arrangement 104, with the result that the display module 108 can be operated and/or actuated by means of the at least one chip of the chip arrangement (for example a driver chip). In accordance with various embodiments, the contact structure arrangement 110d (or a plurality of solder balls 110d or a plurality of pins 110d) can be designed and arranged in such a way that said contact structure arrangement can be matched to a contact arrangement 108c (or contact pad arrangement 108c) of the display module 108, with the result that the display module 108 can be electrically conductively connected directly to the contact structure arrangement 110d by means of the contact arrangement 108c of the display module 108.

In addition, the contact arrangement 108c (or contact pad arrangement 108c) of the display module 108 can be arranged and designed on the side 108b of the display module 108, wherein the side 108b of the display module 108 points in the direction of the chip arrangement 104 or in the direction of the carrier 102.

In accordance with various embodiments, the contact structure arrangement 110d (or a plurality of solder balls 110d or a plurality of pins 110d) can be designed and arranged in such a way that they have a lateral offset (along a direction parallel to the surface 102a of the carrier 102, for example along the direction 101, as is illustrated in FIG. 1A) with respect to the chip arrangement 104. Therefore, the display module 108 can be electrically coupled to the chip arrangement 104, for example, wherein, at the same time, free space can be present on the surface of the chip arrangement 104 in order to apply, for example, a structured security layer, with the result that the chip arrangement 104 can be protected from optical analysis.

In accordance with various embodiments, the thickness of a chip, the chip arrangement 104 or the carrier can be a physical extent along the direction 103, for example perpendicular to the surface 102a of the carrier 102.

Figure 1B:
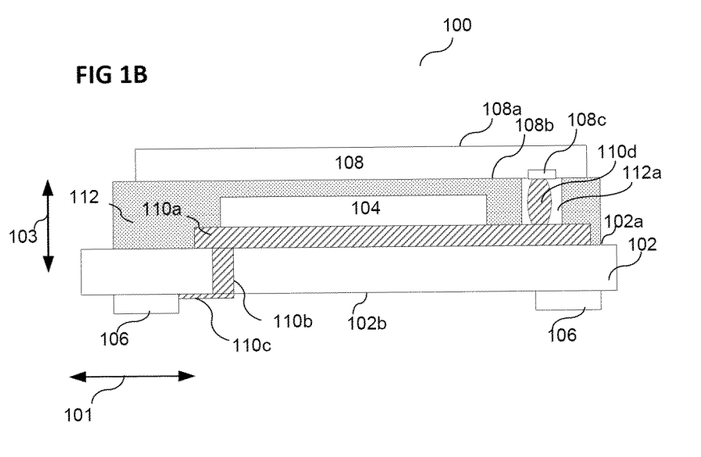

As is illustrated in FIG. 1B in a schematic cross-sectional view or side view, the chip arrangement 104 can be surrounded by a molding compound 112 or casting compound 112 (for example a so-called molding material). The molding compound 112 may include or essentially consist of, for example, an epoxy resin. In addition, the molding compound 112 may include preimpregnated fibers (prepregs) and an epoxy material, for example. In addition, the chip arrangement 104 can be surrounded by a top layer 112 or a region 112 including carbon-fiber-reinforced carbons (CFRC), reinforced carbon-carbon (RCC), carbon fiber carbon composite (CFC)).

In addition, the top layer 112 can have at least one cutout 112a, wherein the smart card module 100 can be designed in such a way that at least one solder ball 110d is arranged in the at least one cutout 112a, with the result that the display module 108 is electrically conductively connected to the first electrical line structure 110a on the first side 102a of the carrier 102 and therefore electrically conductively connected to the chip arrangement 104 through the top layer 112.

In addition, the top layer 112 can have a plurality of cutouts 112a, wherein said cutouts can be designed in such a way that the contact structure arrangement 110d (for example the (solder) ball grid array (BGA) or the (contact) pin grid array (PGA)) is arranged within the cutouts 112a and designed in such a way that, for example, the display module 108 is electrically conductively connected, through the top layer 112, to the first electrical line structure 110a on the first side of the carrier 102 and/or is electrically conductively connected to the chip arrangement 104. For this purpose, the display module 108 can have a contact arrangement 108c on the side 108b which points towards the carrier 102, wherein the contact arrangement 108c of the display module 108 can be matched to the contact structure arrangement 110d on the display module 108.

Figure 1C:
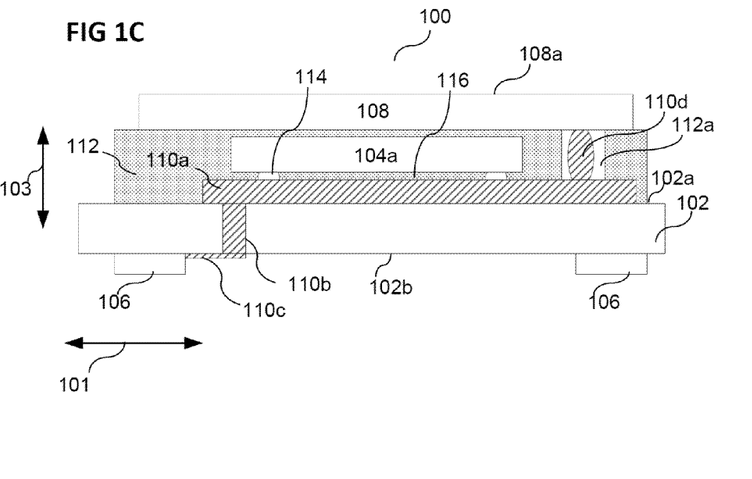

As is illustrated in FIG. 1C in a schematic cross-sectional view or side view, the chip arrangement 104 can have a chip 104a, which can be electrically conductively connected to the first electrical line structure 110a on the first side 102a of the carrier 102 by means of solder ball contacts 114 (by means of a BGA or PGA). In this case, for example, a gap 116 can form between the chip 104a and the first electrical line structure 110a on the first side 102a of the carrier 102, which gap, in an underfill process, for example, can be filled with an underfill material, for example with an epoxy material or with the same material of which the top layer 112 consists.

In accordance with various embodiments, a chip 104a or a plurality of chips of the chip arrangement 104 can be electrically conductively connected to the first electrical line structure 110a on the first side of the carrier 102 by means of adhesive bonding or soldering.

Figure 1D:
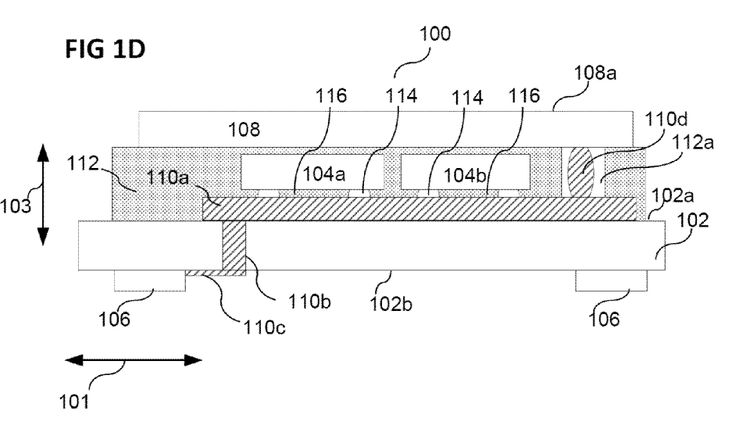

As is illustrated in FIG. 1D in a schematic cross-sectional view or side view, the chip arrangement 104 can have a plurality of chips 104a, 104b. In addition, the chip arrangement 104 can have two chips, for example, wherein a first chip 104a can be electrically coupled to the antenna 106, for example in order to provide a first functionality, and wherein a second chip 104b can be electrically coupled to the display module 108, for example in order to provide a second functionality. Accordingly, for example, the first chip 104a can be an RF chip or an RFID chip, and the second chip 104b can be, for example, a driver chip for the display module 108.

Similarly, the chip arrangement 104 can also have more than two chips, as described previously.

Figure 1E:
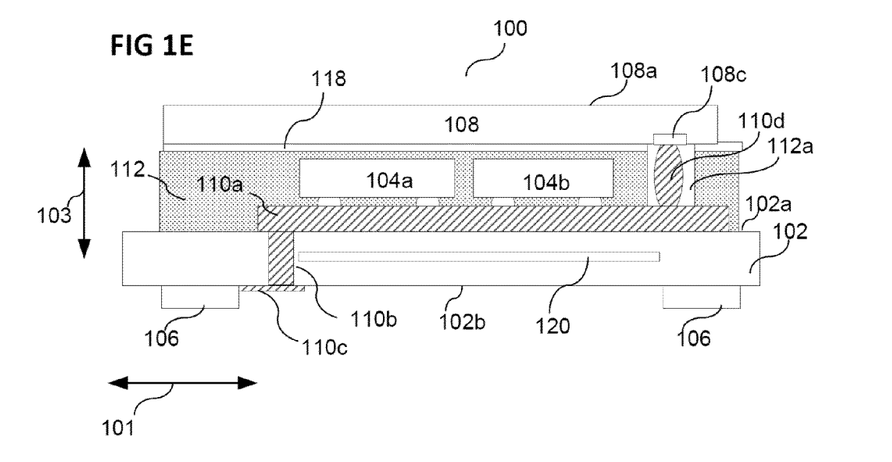

As illustrated in FIG. 1E, the smart card module 100 can also have a structured security layer 118, for example an optical security layer, which can be based on the principle of optical diffraction. In accordance with various embodiments, the structured security layer 118 can have a metalization. The metalization layer can have structures of the order of magnitude of the wavelength of the light of optical analysis devices, for example in the nanometers range. In addition, the metalization layer can have inhomogeneously distributed metalization structure elements, for example partially metallic layers and/or layer stacks with metallic regions in different planes.

In accordance with various embodiments, the structured security layer 118 can be arranged and set up between the chip arrangement 104 and the display module 108. For the purpose of the manipulation security of the chip arrangement 104, it may therefore be necessary to provide the contact 110d of the display module 108 with a lateral offset with respect to the chip arrangement 104.

In addition, the carrier 102 of the smart card module 100 can have a security layer 120 and/or a shielding layer 120. The security layer and/or the shielding layer 120 can prevent, for example, the chip arrangement 104 from possibly being subject to manipulation and/or analysis. For the purpose of the manipulation security of the chip arrangement 104, it may therefore be necessary to provide the contact 110b (by means of the via) of the antenna 106 with a lateral offset with respect to the chip arrangement 104. In accordance with various embodiments, a shielding layer 120 can shield the chip arrangement 104 from electromagnetic radiation, wherein the shielding layer 120 can be or have a metal layer, for example.

In accordance with various embodiments, the carrier 102 can be a multilayer printed circuit board (PCB). In other words, the carrier 102 can consist of or have a plurality of carrier layers. In addition, a carrier layer of the plurality of carrier layers can be a security layer. In addition, a carrier layer of the plurality of carrier layers can be a shielding layer.

In accordance with various embodiments, the chip arrangement 104 can also have an energy source, for example a battery (thin-layer battery). In addition, the chip arrangement 104 can have an energy store, for example a capacitor or a capacitor structure. In addition, the chip arrangement 104 can have a component, which provides, for example, energy for operating the display module 108, for example wireless energy transmission.

In accordance with various embodiments, the smart card module 100 can also have a further antenna or antenna structure, for example on the first side 102a of the carrier 102, wherein the chip arrangement 104 can be surrounded, for example, by the further antenna and can be electrically coupled to the further antenna. In addition, an antenna 106 can be connected to a chip of the chip arrangement, for example electrically conductively connected or inductively coupled.

In accordance with various embodiments, the chip arrangement 104 can have a plurality of chips, wherein said chips can be organized and designed so as to be stacked (in other words so as to form a chip stack).

In accordance with various embodiments, the chips 104a, 104b of the chip arrangement 104 can be arranged next to one another with so-called flip-chip mounting (reverse mounting of the chip).

In addition, the chip arrangement 104 can have a plurality of chips, wherein a chip of the plurality of chips can be a security chip, for example. The security chip can enable reciprocal monitoring of a plurality of chips, for example.

In accordance with various embodiments, a chip of the chip arrangement 104 or a plurality of chips of the chip arrangement 104 can be designed in such a way that chip contacts can be arranged on the reverse of the chip or chips, with the result that the chip(s) can be mounted with the reverse side on the carrier 102 or on the first electrical line structure 110a, for example.

In accordance with various embodiments, the display module 108 can have a thickness in the range of from 50 μm to 500 μm.

In accordance with various embodiments, the display module 108 can be a so-called e-ink (electronic ink) display, also referred to as electronic paper (e-paper for short). The e-paper display can be designed, for example, as a passive (non-illuminating) display or as an active (illuminating) display, for example in combination with backlighting.

In accordance with various embodiments, the display module 108 can be an LED display (light-emitting diode display), i.e. a display device based on light-emitting diodes (LEDs). The LED display module 108 can have, for example, a multiplicity of individual LEDs, which are actuated by means of a driver chip, with the result that data and/or information can be displayed or represented. Similarly, the display module 108 can be an OLED display (organic light-emitting diode display).

In accordance with various embodiments, the display module 108 can be a liquid crystal display (LCD).

Figure 2A:
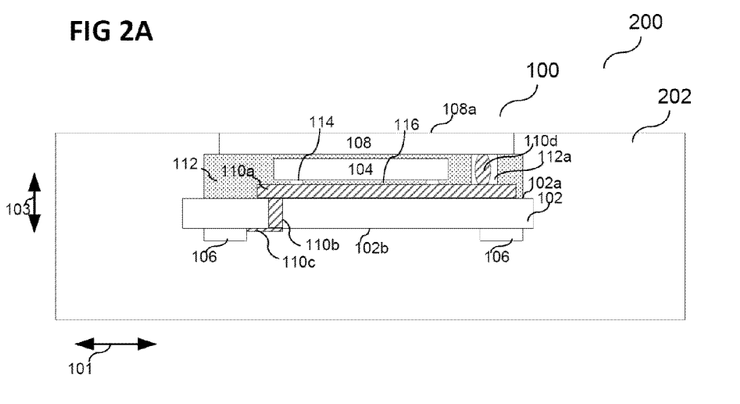
FIGS. 2A to 2C each show a schematic view of a smart card, in accordance with various embodiments.

FIG. 2A shows a schematic cross-sectional view or side view of a smart card 200 having a smart card module 100 and a smart card body 202, in accordance with various embodiments.

In accordance with various embodiments, the smart card 200 can be a standardized smart card in accordance with ISO 7810, and therefore have a corresponding outer shape. For example, the smart card can be an ID 1 document in accordance with ISO 7810 having the external dimensions of 85.6 mm×53.98 mm. In addition, the smart card can be, for example, the data side of a pass (for example a passport or else a personal ID card or driver's license or the like) (ID 3 in accordance with ISO 7810, ICAO 9303). Accordingly, the smart card body 202, in accordance with various embodiments, can have a corresponding outer shape.

In addition, the dimensions and the shape of the smart card body 202 can be selected or adapted as desired, for example.

In addition, the smart card 200 can be designed in such a way that the upper side 108a of the display module 108, i.e. the side 108a of the display module 108 on which the data or information can be represented (on which the image is indicated or the image is visible), points away from the smart card body 202.

In accordance with various embodiments, the smart card module 100 can be connected, for example adhesively bonded, to the smart card body 202, with the result that a functional smart card 200 is formed.

Figure 2B:
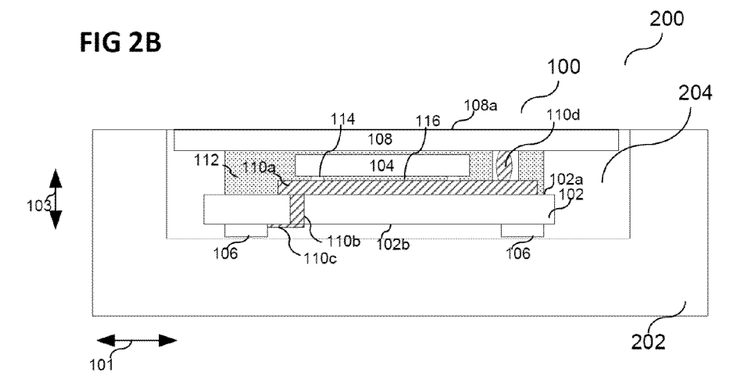

As is illustrated in FIG. 2B, the smart card body 202 can have a cutout 204 for receiving the smart card module 100. In accordance with various embodiments, the size of the cutout, for example along the lateral direction 101 parallel to the surface 102a of the carrier 102 and/or along the direction 103 perpendicular to the surface 102a of the carrier 102, can substantially correspond to the size of the smart card module 100, with the result that the smart card module 100 can be introduced into the cutout 204.

In addition, the smart card module 100 can be adhesively bonded into the cutout 204 by means of an adhesive, with the result that the cutout 204 can be filled, for example, completely or at least partially.

In addition, the smart card module 100 can be connected to the smart card body 202 in such a way that the surface 108a of the display module 108 terminates flush with the surface of the smart card body 202. In addition, the display module 108 can be exposed towards one side of the smart card body.

In addition, the smart card body 202 can have a smart card antenna or smart card body antenna, wherein the smart card antenna or smart card body antenna is inductively coupled to the antenna 106 of the smart card module 100.

In accordance with various embodiments, the smart card module 100 can be fastened or adhesively bonded on and/or in the smart card body 202 by means of an adhesive layer. In accordance with various embodiments, the smart card module can be fastened on the smart card body 202 by means of the front or reverse of said smart card module.

Figure 2C:
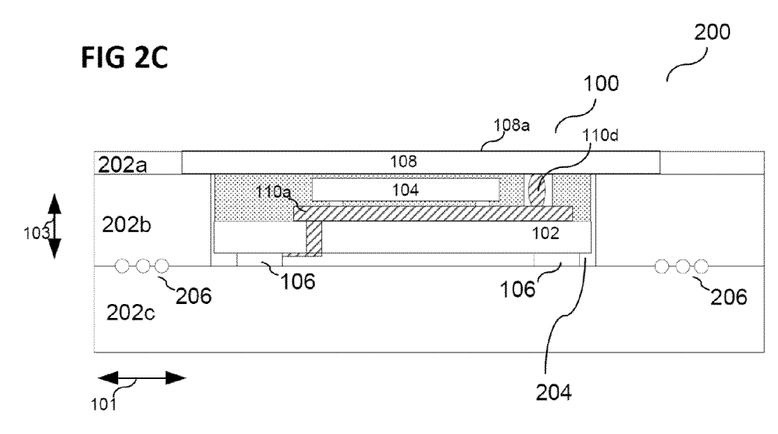

As is illustrated in FIG. 2C, the smart card body 202 can consist of a plurality of plies or layers 202a, 202b, 202c. In this case, the first layer 202a can embed the display module 108, the second layer 202b can embed the carrier 102, the antenna 106 and the chip arrangement 104, and the third layer 202c can cover the smart card module from one side, for example.

In addition, the smart card 200 consisting of the smart card module 100 and the smart card body 202 can have an antenna 206, for example a booster antenna 206, which can be coupled inductively to the antenna 106 of the smart card module 100.

In accordance with various embodiments, the smart card body antenna 206 can be arranged between the second layer 202b and the third layer 202c of the smart card body 202.

In accordance with various embodiments, the antenna 106 of the smart card module 100 and the smart card body antenna 206 of the smart card body 202 can each be arranged in the form of a spiral, with the result that the inductances of the antennas 106, 206 can be increased, for example. In addition, the antenna 106 of the smart card module 100 and the smart card body antenna 206 of the smart card body 202 can be designed in such a way that they couple to one another at resonance.

Figure 3:
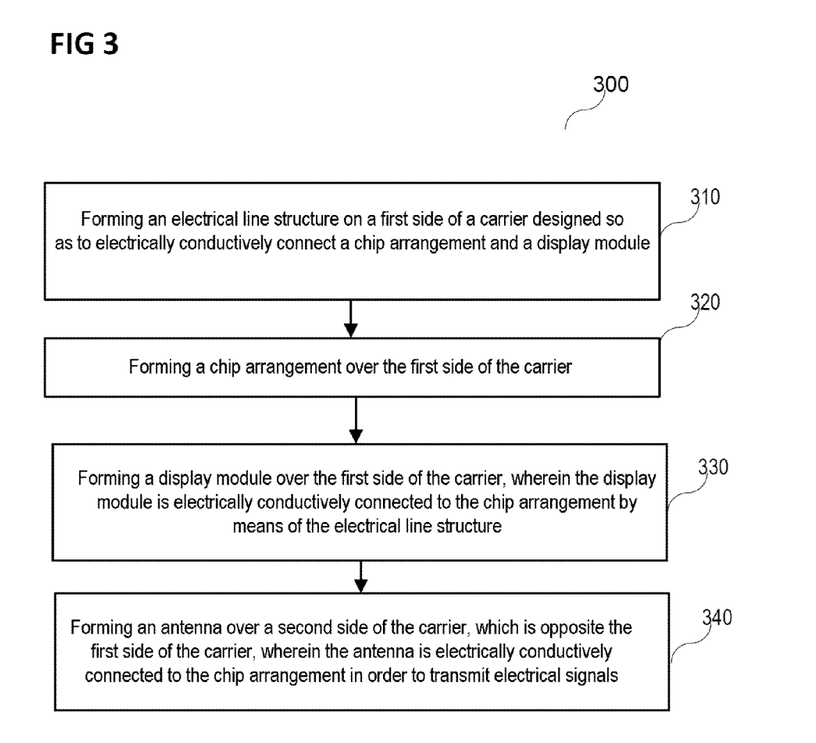
FIG. 3 shows a schematic flow chart for a method for producing a smart card module, in accordance with various embodiments.

FIG. 3 shows a schematic flow chart of a method 300 for producing a smart card module 100. In accordance with various embodiments, the method 300 for producing a smart card module 100 may include the following: at 310, forming an electrical line structure 110a on a first side 102a of a carrier 102 designed so as to electrically conductively connect a chip arrangement 104 and a display module 108; at 320, forming a chip arrangement 104 over the first side 102a of the carrier 102; at 330, forming a display module 108 over the first side 102a of the carrier 102, wherein the display module 108 is electrically conductively connected to the chip arrangement 104 by means of the electrical line structure 110a; and, at 340, forming an antenna 108 over a second side 102b of the carrier 102, which side is opposite the first side 102a of the carrier 102, wherein the antenna 106 is electrically conductively connected to the chip arrangement 104 in order to transmit electrical signals.

In addition, forming a chip arrangement 104 over the first side 102a of the carrier 102 may include forming a chip arrangement 104 over the electrical line structure 110a on the first side 102a of the carrier 102.

In addition, forming a display module 108 over the first side 102a of the carrier 102 may include forming a display module 108 over the chip arrangement 104 on the first side 102a of the carrier 102.

In addition, forming a display module 108 over the first side 102a of the carrier 102 may include fastening a display module 108 over the first side 102a of the carrier 102.

In addition, forming the electrical line structure 110a and/or forming the antenna 106 can be implemented by means of copper etching technology or aluminum etching technology. In addition, forming the electrical line structure 110a and/or forming the antenna 106 may include structuring of a previously applied metal layer.

In addition, the method 300 may include forming a top layer 112 over the chip arrangement 104, for example a dielectric or electrically nonconductive material can be applied and/or structured.

In addition, forming a chip arrangement 104 may include fastening one or more chips on the first side 102a of the carrier 102, with the result that connection contacts of the chip or of the plurality of chips are electrically conductively connected to the electrical line structure 110a.

Various modifications and configurations of the smart card module 100 and details in respect of the smart card 200 and the chip arrangement 104 will be described below, wherein the basic features and modes of operation described with respect to FIG. 1A to FIG. 1E and FIG. 2A to FIG. 2C can be included analogously. In addition, the features and modes of operation described below can be transformed analogously to the smart card module 100 described in FIG. 1A to FIG. 1E and to the smart card 200 described in FIG. 2A to FIG. 2C or combined with the described smart card 200 or the described smart card module 100.

Figure 4A:
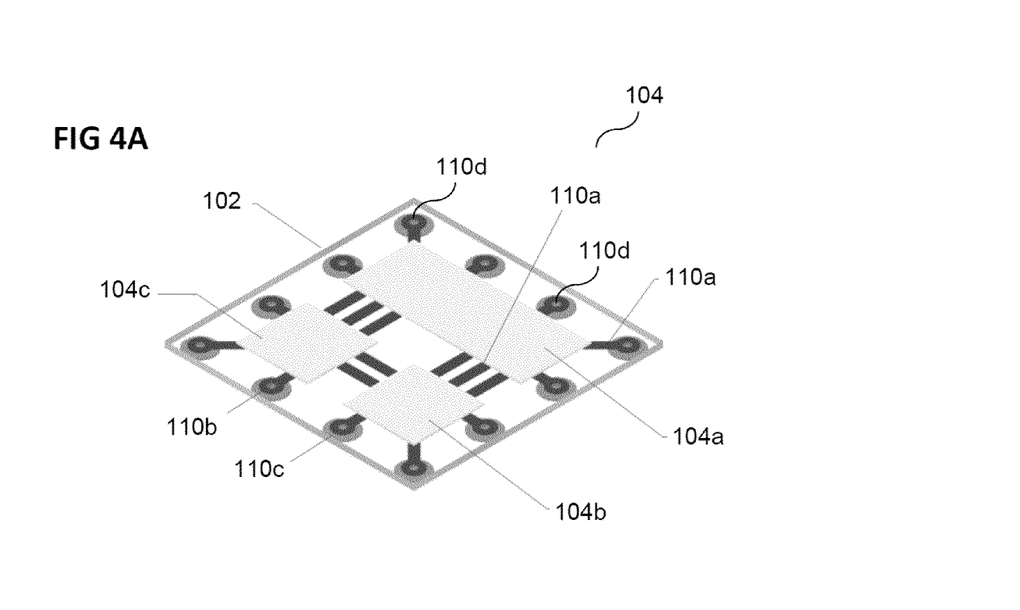
FIGS. 4A to 4C each show a schematic view of detail illustrations of a smart card module, in accordance with various embodiments.

FIG. 4A shows a schematic view of a chip arrangement 104, for example arranged on a carrier 102, wherein the chip arrangement 104 can have a multiplicity of chips, for example three chips 104a, 104b, 104c. In addition, at least one chip of the multiplicity of chips can be electrically conductively connected to another chip of the multiplicity of chips, for example by means of an electrical line structure 110a on the first side 102a of the carrier 102. Therefore, the chips 104a, 104b, 104c can be connected to one another, for example, wherein a chip of the multiplicity of chips can be a security chip, for example, with the result that the manipulation security of the chip arrangement 104 can be increased. As already described, a chip of the multiplicity of chips can be a driver chip for a display module 108, with the result that, for example, an LED display or an OLED display or another display can be operated by means of the chip arrangement 104. For example, data/information stored on a chip of the chip arrangement 104 can also be displayed by means of the display module 108.

In order to connect the chip arrangement 104, for example, contacts 110d (for example a multiplicity of solder balls or pins) can be provided on the first side 102a of the carrier 102; and in addition contacts 110c can be provided by means of vias 110b on the second side of the carrier 102 with respect to the first side 102a of the carrier 102.

In this case, the contacts 110d (for example a multiplicity of solder balls or pins) on the first side 102a of the carrier 102 can be designed in such a way that they match a contact pad arrangement 108c of a display module 108, i.e. the positions and the arrangement of the contacts 110d on the first side 102a of the carrier 102 correspond to the positions and the arrangement of the contact pads 108c of the display module 108, with the result that the display module 108 can be mounted on the carrier 102 and the contact pads 108c of the display module 108 are connected to the contacts 110d (for example a multiplicity of solder balls or pins) on the first side 102a of the carrier 102. In accordance with various embodiments, therefore, at least one contact connection 110d of the smart card module 100 can be matched correspondingly to the corresponding display module 108. This can facilitate, for example, mounting of the display module 108 on the carrier or in the smart card. In other words, the line structure 110a can enable a certain degree of free choice for the positions of the contacts 110d on the carrier 102, wherein the smart card module 100, as already described, is a flexible smart card module 100, and wherein the chip arrangement 104 of the smart card module 100 is formed in one unit, which can be protected from manipulation and/or analysis, for example, by means of additional security layers 118, 120 above and below the chip arrangement 104.

In addition, the smart card module 100 can be designed in such a way that a further contact connection 110c is provided on the second side of the carrier 102, which further contact connection can be electrically conductively connected to an antenna 106 on the second side of the carrier 102, for example.

Figure 4B:
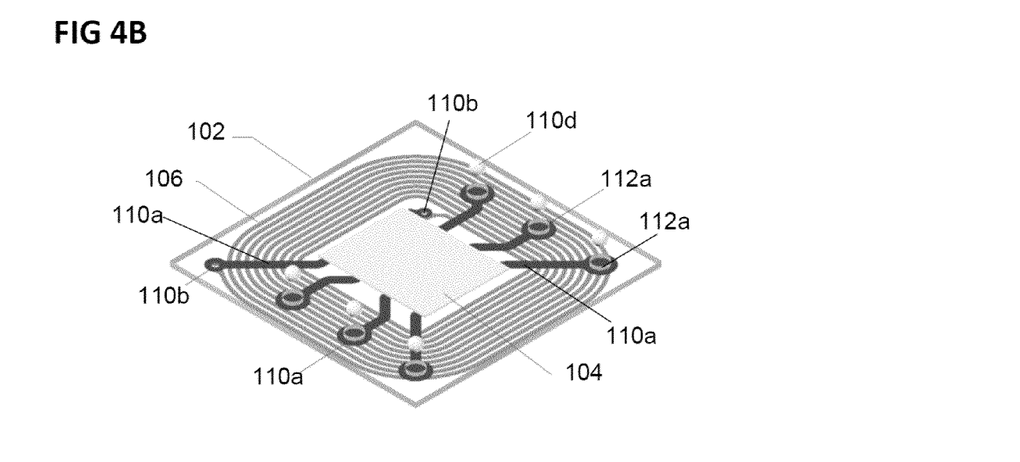

This is illustrated, by way of example, in FIG. 4B in a schematic view of the smart card module 100, wherein the smart card module 100 can have a line structure 110a on the first side 102a of the carrier 102, a chip arrangement 104, and an antenna 106. The line structure 110a on the first side 102a of the carrier 102 can in this case firstly provide the electrical connection of the chip arrangement 104 to the antenna 106 on the second side 102b of the carrier 102 (by means of the vias 110b) and secondly the electrical connection of the chip arrangement 104 to a display module 108 (by means of the solder balls 110d). The solder balls 110d can be arranged, for example, in the cutouts 112a in the top layer 112, as previously described. The top layer 112 and the carrier 102 are illustrated as being transparent for illustrative purposes in FIG. 4B.

Figure 4C:
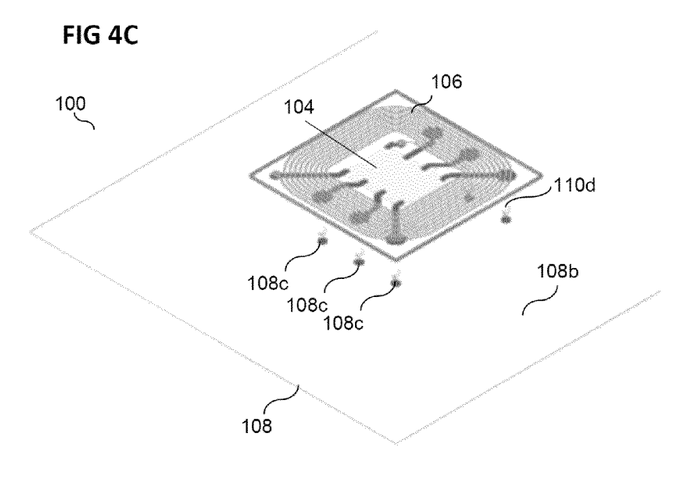

In addition, FIG. 4C shows a smart card module comprising a display module 108 in a schematic perspective illustration. In accordance with various embodiments, the display module 108 can have an electrical display module contact 108c (a contact pad 108c) or a plurality of electrical display module contacts 108c (contact pads) on that side 108b which points in the direction of the carrier 102 or towards the interior of the smart card body 202. In addition, the first line structure 110a on the first side 102a of the carrier 102 can be designed in such a way that the chip arrangement 104 can be electrically connected to the display module contacts 108c by means of the solder balls 110d (or by means of another suitable contact structure 110d).

In accordance with various embodiments, the smart card module 100 described herein and the smart card 200 described herein can be designed in accordance with the ISO standard 7816. The production of the smart card module 100 and of the smart card 200 may include typical processes for printed circuit board technology, inter alia, for example, drilling, coating or metalization, through-plating (vias), photoresist coating, lamination, structuring, exposure to light, development, etching, soldering, adhesive bonding or the like.

In accordance with various embodiments, described herein is a possibility for making contact between a display 108 and an ultrathin package (containing the carrier 102, the chip arrangement 104, the antenna 106 and the top layer 112).

Figure 5:
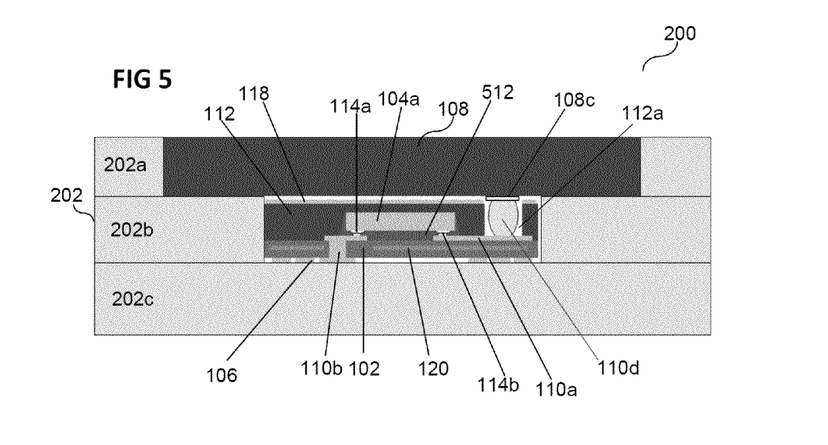
FIG. 5 shows a schematic view of a smart card, in accordance with various embodiments.

As illustrated in FIG. 5, a smart card module 100 can be embedded in a multilayered smart card housing 202, as described previously, and form a smart card 200. In addition, for example, a first chip contact 114a of the chip 104a (or of a chip 104a of the chip arrangement 104) can be electrically conductively connected to the antenna 106, for example by means of the via 110b. In addition, a second chip contact 114b of the chip 104a (or of a chip 104a of the chip arrangement 104) can be electrically conductively connected to the display module 108, for example by means of the solder contact 110d.

In accordance with various embodiments, the chip 104a or a chip 104a of the chip arrangement 104 can be fastened on the carrier 102 by means of an adhesive 512 or adhesive material 512, wherein the electrical contact to the line structure on the first side 102a of the carrier 102 can be performed by means of the chip contact 114a, 114b, preferably by means of solder balls. In addition, the chip 104a or a chip 104a of the chip arrangement 104 can be at least partially surrounded by a molding compound 112 or a top layer 112.

A radiofrequency (RF) can be, for example, a frequency of an electromagnetic wave from the radiofrequency band, for example between a few kilohertz up to a few hundred gigahertz, for example in a range of approximately 3 kHz to approximately 300 GHz.

In accordance with various embodiments, a thin and nevertheless robust and inexpensive smart card module is provided which can contain a plurality of chips (a so-called multichip package) and/or at least two different contact connection possibilities (for example solder contact 110d and coil 106), for example with electrically conductive contact via contacts and/or pins and/or electromagnetically coupled without touching contact by means of an integrated coil (antenna) by virtue of electromagnetic coupling with a booster antenna.

In accordance with various embodiments, a smart card module 100 can be used in smart cards with various form factors, for example documents with ID1 or ID3 format (for example an e-passport) or in mobile applications (cellular telephones, tablets, smart phones, ebooks or the like).

Since the smart card module 100 can have, for example, at least two different contact connection possibilities, the smart card module 100 can therefore simultaneously operate a plurality of functionalities, for example the connection of a display 108 by virtue of touching contact (for example the solder deposit 110d) and response of a booster antenna 206 via the contactless contact-making 106.

In accordance with various embodiments, the complexity of the design of the smart card module can be reduced by means of the use of a monolithic module. In addition, this module can have interfaces and/or contacts matched to external components, with the result that the complexity of the mounting processes can be reduced for the smart card module producer.

In accordance with various embodiments, the smart card module can have a chip or a plurality of (different) chips in a thin and nevertheless robust and inexpensive module for smart card applications which can have at least two different contact interfaces (110c, 110d).

In accordance with various embodiments, the smart card described herein provides a relatively uncomplicated and inexpensive inlay design (smart card module design). The smart card module can have, for example, a small area requirement or space requirement. In addition, a mounting process simplified for the inlay manufacturer can be made possible. Furthermore, the smart card module 100 and the smart card 200 can provide an advantage with respect to security since no individual modules are used which can be manipulated markedly more easily than the smart card module 100 described herein, which smart card module is self-contained and matched to one another and in which smart card module security features (for example structured interlayers) can optionally be introduced.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A smart card module, comprising:
a carrier;
a chip arrangement arranged over a first side of the carrier so that the first side of the carrier faces towards the chip arrangement;
an antenna arranged over a second side of the carrier so that the second side of the carrier faces towards the antenna, wherein the second side of the carrier is opposite the first side of the carrier;
wherein the antenna is electrically conductively connected to the chip arrangement in order to transmit electrical signals;
a display module arranged over the first side of the carrier and over the chip arrangement so that the first side of the carrier faces towards the display module;
a structured security layer arranged above the chip arrangement and below the display module, wherein the security layer covers the chip arrangement; and
at least one electrical line structure arranged on the first side of the carrier, which electrically connects the chip arrangement and the display module to one another through an electrical connection that passes through the structured security layer.

2. The smart card module of claim 1,
wherein the chip arrangement has a plurality of chips.

3. The smart card module of claim 2,
wherein at least one first chip of the plurality of chips is electrically conductively connected to at least one second chip of the plurality of chips.

4. The smart card module of claim 3, further comprising:
at least one additional electrical line structure arranged on the first side of the carrier, which electrical line structure electrically conductively connects the at least one first chip of the plurality of chips to the at least one second chip of the plurality of chips.

5. The smart card module of claim 1,
wherein the chip arrangement has a driver chip, which is designed to activate the display module.

6. The smart card module of claim 1,
wherein the chip arrangement further has a memory chip.

7. The smart card module of claim 1,
wherein the chip arrangement has a security chip, which is designed to provide at least one cryptographic service.

8. The smart card module of claim 1,
wherein a chip or the plurality of chips of the chip arrangement has or have a thickness in a region of less than approximately 100 μm.

9. The smart card module of claim 1,
wherein the carrier has a thickness in a region of less than approximately 100 μm.

10. The smart card module of claim 1,
wherein the electrical line structure has at least one electrically conductive solder ball and at least one electrical conductor track;
wherein the at least one electrical conductor track extends parallel to the first side of the carrier on the first side of the carrier; and
wherein the at least one solder ball electrically conductively connects the at least one conductor track to at least one contact pad of the display module.

11. The smart card module of claim 1,
wherein at least one chip of the chip arrangement is at least partially surrounded by a molding compound.

12. The smart card module of claim 1,
wherein the display module has an electronic paper display.

13. The smart card module of claim 1,
wherein the display module has a light-emitting diode display.

14. The smart card module of claim 1,
wherein the display module has a liquid crystal display.

15. A smart card, comprising:
a smart card module, comprising:
   a carrier;
   a chip arrangement arranged over a first side of the carrier so that the first side of the carrier faces towards the chip arrangement;
   an antenna arranged over a second side of the carrier so that the second side of the carrier faces towards the antenna, wherein the second side of the carrier is opposite the first side of the carrier;
   wherein the antenna is electrically conductively connected to the chip arrangement in order to transmit electrical signals;
   a display module arranged over the first side of the carrier so that the first side of the carrier faces towards the display module;
   a structured security layer arranged between the chip arrangement and the display module, wherein the security layer covers the chip arrangement; and
   at least one electrical line structure arranged on the first side of the carrier, which electrically connects the chip arrangement and the display module to one another through an electrical connection that passes through the structured security layer;
a smart card body, wherein the smart card module is connected to the smart card body.

16. The smart card of claim 15,
wherein the smart card module is connected to the smart card body and designed in such a way that the display module is exposed towards one side of the smart card body.

17. The smart card of claim 15, further comprising:
a smart card body antenna arranged in the smart card body, wherein the smart card body antenna is inductively coupled to the antenna of the smart card module.

18. A chip module, comprising:
a flexible carrier;
a chip arrangement arranged on a first side of the carrier so that the first side of the carrier faces towards the chip arrangement, said chip arrangement comprising a plurality of chips;
a contact structure arranged on a second side of the carrier so that the second side of the carrier faces towards the chip arrangement, wherein the second side of the carrier is opposite the first side of the carrier;
wherein the contact structure is electrically conductively connected to at least one chip of the plurality of chips;
at least one electrical line structure arranged on the first side of the carrier, which electrically connects at least two chips of the plurality of chips to one another;
at least one security layer arranged over the first side of the carrier for preventing an optical analysis of the chip arrangement, wherein the at least one security layer covers the chip arrangement; and
a display element arranged over the first side of the carrier so that the first side of the carrier faces towards the display module and so that the at least one security layer is arranged between the display element and the chip arrangement, wherein the display element is electrically conductively connected to at least one chip of the plurality of chips by means of the electrical line structure and an electrical connection that passes through the at least one security layer.

19. The chip module of claim 18, further comprising:
an antenna arranged on the second side of the carrier, wherein the antenna is electrically conductively connected to the contact structure.

20. The chip module of claim 18,
wherein each chip of the plurality of chips has a thickness in a region of less than approximately 100 µm.

21. The chip module of claim 18,
wherein the flexible carrier comprises at least one of a polymeric material or a laminate material.

22. The chip module of claim 18,
wherein the flexible carrier has a thickness in a region of less than approximately 100 µm.

23. A method for producing a smart card module, the method comprising:
   forming an electrical line structure on a first side of a carrier designed in such a way as to electrically conductively connect a chip arrangement and a display module;
   forming the chip arrangement over the first side of the carrier so that the first side of the carrier faces towards the chip arrangement;
   forming a structured security layer over the first side of the carrier so as to cover the chip arrangement;
   forming the display module over the first side of the carrier, wherein the display module is electrically connected to the chip arrangement by means of the electrical line structure so that the structured security layer is arranged between the chip arrangement and the display module; and
   forming an antenna over a second side of the carrier, which is opposite the first side of the carrier so that the second side of the carrier faces towards the antenna, wherein the antenna is electrically conductively connected to the chip arrangement in order to transmit electrical signals.

24. The smart card module of claim 1, wherein the electrical connection electrically connects to a contact of the display module positioned laterally offset with respect to the chip arrangement.

* * * * *